United States Patent
Okuno

(10) Patent No.: US 11,955,581 B2
(45) Date of Patent: Apr. 9, 2024

(54) GROUP III NITRIDE SEMICONDUCTOR DEVICE AND PRODUCTION METHOD THEREFOR

(71) Applicant: TOYODA GOSEI CO., LTD., Kiyosu (JP)

(72) Inventor: Koji Okuno, Kiyosu (JP)

(73) Assignee: TOYODA GOSEI CO., LTD., Kiyosu (JP)

(*) Notice: Subject to any disclaimer, the term of this patent is extended or adjusted under 35 U.S.C. 154(b) by 349 days.

(21) Appl. No.: 17/369,328

(22) Filed: Jul. 7, 2021

(65) Prior Publication Data
US 2022/0013687 A1     Jan. 13, 2022

(30) Foreign Application Priority Data
Jul. 9, 2020 (JP) .................. 2020-118480

(51) Int. Cl.
*H01L 33/00* (2010.01)
*C30B 25/16* (2006.01)
(Continued)

(52) U.S. Cl.
CPC .......... *H01L 33/12* (2013.01); *C30B 25/165* (2013.01); *C30B 29/403* (2013.01);
(Continued)

(58) Field of Classification Search
CPC ... C30B 29/406; C30B 29/403; C30B 25/165; C30B 25/14; C30B 25/183; H01L 33/12;
(Continued)

(56) References Cited

U.S. PATENT DOCUMENTS 6,617,182 B2 * 9/2003 Ishida ................ H01L 21/0254
                                               257/E21.127
6,627,520 B2 * 9/2003 Kozaki ............... H01L 21/0242
                                                  438/479

(Continued)

FOREIGN PATENT DOCUMENTS

JP     H11-026812 A     1/1999
JP     H11-340580 A    12/1999
(Continued)

OTHER PUBLICATIONS

Japanese Office Action, dated Apr. 12, 2023, in Japanese Application No. 2020-118480 and English Machine Translation thereof.

*Primary Examiner* — Savitri Mulpuri
(74) *Attorney, Agent, or Firm* — MCGINN I.P. LAW GROUP, PLLC

(57) ABSTRACT

The present invention provides a method for producing a Group III nitride semiconductor device which can relax strain between a Group III nitride semiconductor layer containing In and a semiconductor layer adjacent thereto, and a production method therefor. The well layer is a Group III nitride semiconductor layer containing In. The barrier layer is a Group III nitride semiconductor layer. The well layer and the barrier layer are brought into contact with each other in at least one of growing a well layer and growing a barrier layer. A gas containing hydrogen gas as a carrier gas is used in growing a well layer and growing a barrier layer. In growing a barrier layer, the flow rate of hydrogen gas is higher than the flow rate of hydrogen gas in growing a well layer.

15 Claims, 11 Drawing Sheets

(51) Int. Cl.
    *C30B 29/40* (2006.01)
    *H01L 33/06* (2010.01)
    *H01L 33/12* (2010.01)
    *H01L 33/32* (2010.01)
    *C30B 25/18* (2006.01)

(52) U.S. Cl.
    CPC ........ *C30B 29/406* (2013.01); *H01L 33/0075* (2013.01); *H01L 33/06* (2013.01); *H01L 33/32* (2013.01); *C30B 25/183* (2013.01)

(58) Field of Classification Search
    CPC ... H01L 33/06; H01L 33/007; H01L 33/0075; H01L 33/32
    See application file for complete search history.

(56) References Cited

U.S. PATENT DOCUMENTS

| | | | |
|---|---|---|---|
| 7,456,034 B2* | 11/2008 | Ikedo | H01L 33/32 |
| | | | 257/E21.093 |
| 8,969,920 B2 | 3/2015 | Kiyama et al. | |
| 11,211,527 B2* | 12/2021 | Wildeson | H01L 33/20 |
| 11,282,982 B2* | 3/2022 | Chang | H01L 33/10 |
| 2011/0042646 A1* | 2/2011 | Ohta | H01S 5/320275 |
| | | | 257/E29.069 |
| 2011/0101404 A1* | 5/2011 | Fu | H01L 33/22 |
| | | | 257/E33.07 |
| 2012/0068214 A1* | 3/2012 | Kuo | H01L 33/007 |
| | | | 257/E33.068 |
| 2013/0168739 A1 | 7/2013 | Kiyama et al. | |
| 2014/0045289 A1* | 2/2014 | Nago | C23C 16/301 |
| | | | 438/47 |
| 2014/0131734 A1* | 5/2014 | Ting | H01L 33/025 |
| | | | 257/76 |
| 2017/0069793 A1* | 3/2017 | Saito | H01L 33/12 |

FOREIGN PATENT DOCUMENTS

| | | |
|---|---|---|
| JP | 2001-015809 A | 1/2001 |
| JP | 2006-210692 A | 8/2006 |
| JP | 2006-237091 A | 9/2006 |
| JP | 2010-251612 A | 11/2010 |
| JP | 2014-038913 A | 2/2014 |

* cited by examiner

GROUP III NITRIDE SEMICONDUCTOR DEVICE AND PRODUCTION METHOD THEREFOR

BACKGROUND OF THE INVENTION

Field of the Invention

The present invention relates to a Group III nitride semiconductor device and a production method therefor.

Background Art

In Group III nitride semiconductor represented by GaN, band gap is varied from 0.6 eV to 6 eV by varying the composition thereof. Therefore, Group III nitride semiconductor has been applied to a light-emitting device emitting light of a wide range of wavelengths from near infrared to deep ultraviolet, a laser diode, or a light receiving device receiving light of such a range of wavelengths.

For example, in a Group III nitride semiconductor light-emitting device, a light-emitting layer has a well layer and a barrier layer. The well layer and the barrier layer have different compositions. Junction of the well layer and the barrier layer makes a hetero junction structure. Since the well layer and the barrier layer have different lattice constants, a strain is generated at an interface therebetween. Strain deteriorates crystallinity and degrades device characteristics. Therefore, strain needs to be relaxed, and the technique therefor has been developed. Patent Document 1 discloses a technique of forming a region 42 between a well layer 43 and a barrier layer 41. The region 42 is a layer whose composition is gradually varied from the lattice constant of the well layer 43 to the lattice constant of the barrier layer 41 (FIG. 3 of Patent Document 1).

Patent Document 1: Japanese Patent Application Laid-Open (kokai) No. 2006-210692

Usually, a light-emitting layer of a light-emitting device has a quantum well structure comprising a well layer and a barrier layer. In the quantum well structure, due to quantum mechanics, when a thickness of the well layer is smaller than a de Broglie wavelength, electrons show wave property. On account of that, in a conduction band and a valence band, the degeneracy of energy level is resolved, and energy is discretized, thereby forming a sub-band. As a result of this, electrons and holes confined in the quantum well have discrete energy levels. A transition between any one of sub-bands of the conduction band and any one of sub-bands of the valence band is faster than a transition between bands of degenerated conduction band and valence band. Therefore, light emission efficiency or response speed is expected to be improved when applying to an optical device.

However, the well layer and the barrier layer have different lattice constants, and a strain is generated at an interface between the well layer and the barrier layer. This strain causes two large problems.

The first problem is deterioration of crystal quality due to a lattice mismatch. When the lattice mismatch is too large, a defect such as misfit dislocation occurs, that defect acts as a non-radiative center. Also, three-dimensional growth is caused due to strain, and the surface flatness of semiconductor is lost. As a result, uneven crystal is formed in any area of the surface, a non-radiative center such as point defect is formed. These are the factors deteriorating the efficiency of the light-emitting device.

The second problem is quantum-confined stark effect (QCSE) caused by piezoelectric field or quantum-confined Franz-Keldysh effect (QCFK). When band bending is caused by piezoelectric field, full width at half maximum (FWHM) in a radiative spectrum is increased due to broadening of a transition between bands. Moreover, superposition of electrons and holes is reduced, and emission probability is reduced.

Such strain is generated not only on an interface between well and barrier layers of the light-emitting layer but between the light-emitting layer and a layer thereabove or a layer therebelow. Therefore, strain from the upper base layer or the lower base layer has a large influence. The above problems occur at all interfaces with lattice mismatch. Therefore, strain is preferably relaxed as much as possible. With the technique disclosed in Patent Document 1, the effect of relaxing strain is not sufficiently achieved.

SUMMARY OF THE INVENTION

In view of the foregoing, an object of the present invention is to provide a Group III nitride semiconductor device which can relax strain between a Group III nitride semiconductor layer containing In and a semiconductor layer adjacent thereto, and a production method therefor.

In a first aspect of the present invention, there is provided a method for producing a Group III nitride semiconductor device, the method comprising:

growing a first semiconductor layer and growing a second semiconductor layer, wherein the first semiconductor layer is a Group III nitride semiconductor layer containing In, the second semiconductor layer is a Group III nitride semiconductor layer, the second semiconductor layer has a band gap larger than a band gap of the first semiconductor layer, and a flow rate of hydrogen gas used as a carrier gas in growing a second semiconductor layer is larger than a flow rate of the hydrogen gas in growing a first semiconductor layer.

In the first aspect of the present invention, the flow rate of the hydrogen gas is preferably linearly increased or decreased at least one of an initial stage and a final stage of the growth of the second semiconductor layer.

A mixture gas of hydrogen gas and nitrogen gas is preferably used as a carrier gas in growing a first semiconductor layer and the second semiconductor layer, The first semiconductor layer and the second semiconductor layer may be brought into contact with each other in growing a first semiconductor layer and the second semiconductor layer.

The flow rate of a raw material gas containing In is preferably constant in growing a first semiconductor layer and the second semiconductor layer.

The flow rate of a raw material gas containing In in growing a first semiconductor layer, is preferably higher than a flow rate of a raw material gas containing In in growing a second semiconductor layer.

In growing a second semiconductor layer, a variable composition layer in which an In composition is varied continuously in a streamline shape along the deposition direction of the second semiconductor layer and an intermediate layer sandwiched between two variable composition layers are preferably formed.

The second semiconductor layer is a Group III nitride semiconductor layer containing In, and the second semiconductor layer preferably has an average In composition lower than an average In composition of the first semiconductor layer.

The first semiconductor layer is preferably a well layer, and the second semiconductor layer is preferably a barrier layer.

The first semiconductor layer is an active layer, and the second semiconductor layer is a guide layer. The active layer preferably has an average In composition higher than an average In composition of the guide layer.

A second aspect of the present invention is drawn to a method for producing a Group III nitride semiconductor having a hetero junction of layers having different band gaps, a layer having a smaller bandgap including In, the method comprising at least one of a first case and a second case, wherein, in the first case, hydrogen gas as a carrier gas is continuously increased in forming a layer having a larger band gap from the layer having the smaller band gap, and in the second case, a variable rate, i.e., differential value of band gap in the deposition direction is continuously increased, and is discontinuous with a variable rate of band gap of the layer having the smaller bandgap.

In the second aspect of the present invention, preferably, in the first case, a variable rate of band gap in the deposition direction is continuously decreased to become equal to a variable rate of band gap of the layer having the larger bandgap, and in the second case, a variable rate of band gap in the deposition direction is continuously increased, and is discontinuous with a variable rate of band gap of the layer having the smaller bandgap.

In the second aspect of the present invention, moreover, preferably, in the first case, a variable rate of In composition ratio in the deposition direction is continuously decreased, and in the second case, a variable rate of In composition ratio in the deposition direction is continuously increased.

In the second aspect of the present invention, preferably, a flow rate of a raw material gas as a component of the Group III nitride semiconductor is constant.

According to these features, the variation of the bandgap and the composition is sharp at the boundary between the layer having the smaller band gap and the layer having the larger band gap. And the bandgap and the composition are varied smooth and connected to the area in which the bandgap and the composition is constant in the layer having the larger band gap. Accordingly, a sharp bandgap of the layer having the smaller band gap and a fine crystallinity of the layer having the larger band gap are obtained.

In a third aspect of the present invention, there is provided a Group III nitride semiconductor device comprising:

a first semiconductor layer and a second semiconductor layer in contact with the first semiconductor layer, wherein the first semiconductor layer is a Group III nitride semiconductor layer containing In, the second semiconductor layer is a Group III nitride semiconductor layer, the second semiconductor layer has a band gap larger than a band gap of the first semiconductor layer, and the second semiconductor layer comprises a variable composition layer in which an In composition is varied continuously in a streamline shape in the direction perpendicular to the surface in contact with the first semiconductor layer, and an intermediate layer sandwiched between two variable composition layers.

The Group III nitride semiconductor device produced by this production method, includes a first semiconductor layer and a second semiconductor layer. In at least a part of the second semiconductor layer, In composition is varied continuously in a streamline shape in the direction perpendicular to the surface in contact with the first semiconductor layer. Therefore, strain is sufficiently relaxed between the first semiconductor layer and the second semiconductor layer.

The present invention disclosed in the specification provides a Group III nitride semiconductor device which can relax strain between a Group III nitride semiconductor layer containing In and a semiconductor layer adjacent thereto, and a production method therefor.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
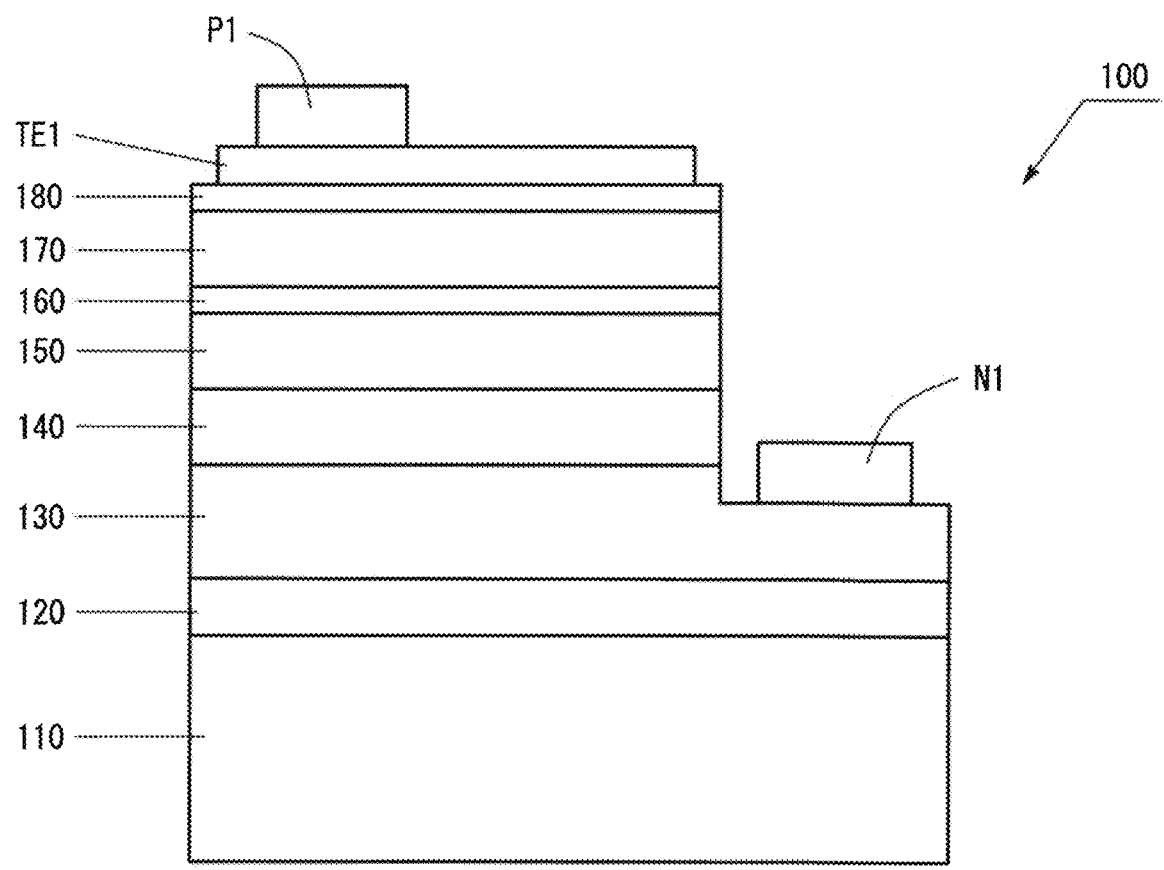
FIG. 1 is a schematic view of the structure of a light-emitting device according to a first embodiment.

With reference to the drawings, specific embodiments of the Group III nitride semiconductor device and the production method therefor as examples will next be described. However, the present invention is not limited to these embodiments. The below-described deposition structure of the layers of the semiconductor device and the electrode structure are given only for illustrative purpose, and other deposition structures differing therefrom may also be employed. The thickness of each of the layers shown in the drawings is not an actual value, but a conceptual value.

First Embodiment

1. Semiconductor Light-Emitting Device (LED)

FIG. 1 is a schematic view of the structure of a light-emitting device according to a first embodiment. The light-emitting device 100 is a face-up type semiconductor light-emitting device. The light-emitting device 100 has a plurality of semiconductor layers formed of a Group III nitride semiconductor. As shown in FIG. 1, the light-emitting device 100 has a substrate 110, a buffer layer 120, an n-type contact layer 130, an n-side electrostatic breakdown preventing layer 140, an n-side superlattice layer 150, a light-emitting layer 160, an electron blocking layer 170, a p-type contact layer 180, a transparent electrode TE1, a p-electrode P1, and an n-electrode N1.

On the main surface of the substrate 110, the buffer layer 120, the n-type contact layer 130, the n-side electrostatic breakdown preventing layer 140, the n-side superlattice layer 150, the light-emitting layer 160, the electron blocking layer 170, and the p-type contact layer 180 are formed in this order. The n-electrode N1 is formed on the n-type contact layer 130. The p-electrode P1 is formed on the transparent electrode TE1. Here, the n-type contact layer 130, the n-side electrostatic breakdown preventing layer 140, and the n-side superlattice layer 150 are an n-type semiconductor layer. The electron blocking layer 170 and the p-type contact layer 180 are a p-type semiconductor layer. However, these layers may partially contain an undoped layer. Thus, the light-emitting device 100 has the n-type semiconductor layer, the light-emitting layer on the n-type semiconductor layer, the p-type semiconductor layer on the light-emitting layer, the transparent electrode TE1 on the p-type semiconductor layer, the p-electrode P1 on the transparent electrode TE1, and the n-electrode N1 on the n-type semiconductor layer.

The substrate 110 is a substrate supporting the semiconductor layers. The main surface of the substrate 110 is, for example, a c-plane. The substrate 110 is, for example, a sapphire substrate, a GaN substrate, an AlN substrate, a Si substrate, and SiC substrate.

The buffer layer 120 is formed on the main surface of the substrate 110. When using a substrate such as a sapphire substrate in which a hetero junction is formed because the substrate has a lattice constant different from semiconductor being grown thereon, the buffer layer 120 is, for example, a low-temperature AlN buffer layer. The buffer layer 120 may be a layer other than that. When using a substrate such as a GaN substrate in which a homo junction is formed because the substrate has a lattice constant same as semiconductor layer being grown thereon, the buffer layer 120 may be omitted.

The n-type contact layer 130 is formed of, for example, Si-doped n-type $Al_xGa_{1-x}N$ (0≤x<1). The n-type contact layer 130 is formed on the buffer layer 120. The n-type contact layer 130 is in contact with the n-electrode N1.

The n-side electrostatic breakdown preventing layer 140 is a layer for preventing electrostatic breakdown of the semiconductor layers. The n-side electrostatic breakdown preventing layer 140 is formed on the n-type contact layer 130. The n-side electrostatic breakdown preventing layer 140 has a deposition structure of, for example, an i-AlGaN layer formed of undoped i-$Al_xGa_{1-x}N$ (0≤x<1) and an n-type AlGaN layer formed of Si-doped n-type $Al_xGa_{1-x}N$ (0≤x<1).

The n-side superlattice layer 150 controls the injection amount of electrons to the light-emitting layer 160. More specifically, the n-side superlattice layer 150 has a superlattice structure. The n-side superlattice layer 150 has a structure in which, for example, an $In_yGa_{1-y}N$ (0≤y<1) layer and an n-type $Al_xGa_{1-x}N$ (0≤x<1) layer are repeatedly deposited. Needless to say, the n-side superlattice layer 150 may have any other semiconductor layer such as an $Al_xIn_yGa_{1-x-y}N$ (0≤x≤1 and 0≤y≤1) layer.

The light-emitting layer 160 emits light through recombination of an electron with a hole. The light-emitting layer 160 is formed on the n-side superlattice layer 150. The light-emitting layer has at least a well layer and a barrier layer.

The electron blocking layer 170 is formed on the light-emitting layer 160. The electron blocking layer 170 has a structure formed by repeatedly depositing, for example, a layered structure of a p-type GaN layer, a p-type AlGaN layer, and a p-type InGaN layer. The p-type AlGaN layer of the electron blocking layer 170 plays a role of blocking electrons. Therefore, the electron blocking layer may not be a p-type GaN layer and a p-type InGaN layer. That is, the electron blocking layer 170 may be a single p-type AlGaN layer.

The p-type contact layer 180 is a semiconductor layer electrically connected to the p-electrode P1. The p-type contact layer 180 is in contact with the transparent electrode TE1. The p-type contact layer 180 is formed on the electron blocking layer 170. The p-type contact layer 180 is, for example, an Mg-doped p-type $Al_xGa_{1-x}N$ (0≤x<1) layer.

The transparent electrode TE1 is formed on the p-type contact layer 180. The transparent electrode TE1 is made of ITO (Indium Tin Oxide). In addition to ITO, transparent conductive oxide such as IZO (Indium Zinc Oxide), ICO (Indium cerium oxide), ZnO, $TiO_2$, $NbTiO_2$, and $TaTiO_2$ may be used.

The p-electrode P1 is formed on the transparent electrode TE1. The p-electrode P1 is electrically connected to the p-type contact layer 180 via the transparent electrode TE1. The p-electrode P1 is, for example, a metal electrode made of a metal such as Ni, Au, Ag, Co, and In, a layered structure of these metals or an alloy of these metals.

The n-electrode N1 is formed on the n-type contact layer 130. The n-electrode N1 is in contact with the n-type contact layer 130. The n-electrode N1 is, for example, a metal such as Ni, Au, Ag, Co, In, and Ti, a layered structure of these metals or an alloy of these metals.

2. Light Emitting Layer

Figure 2:
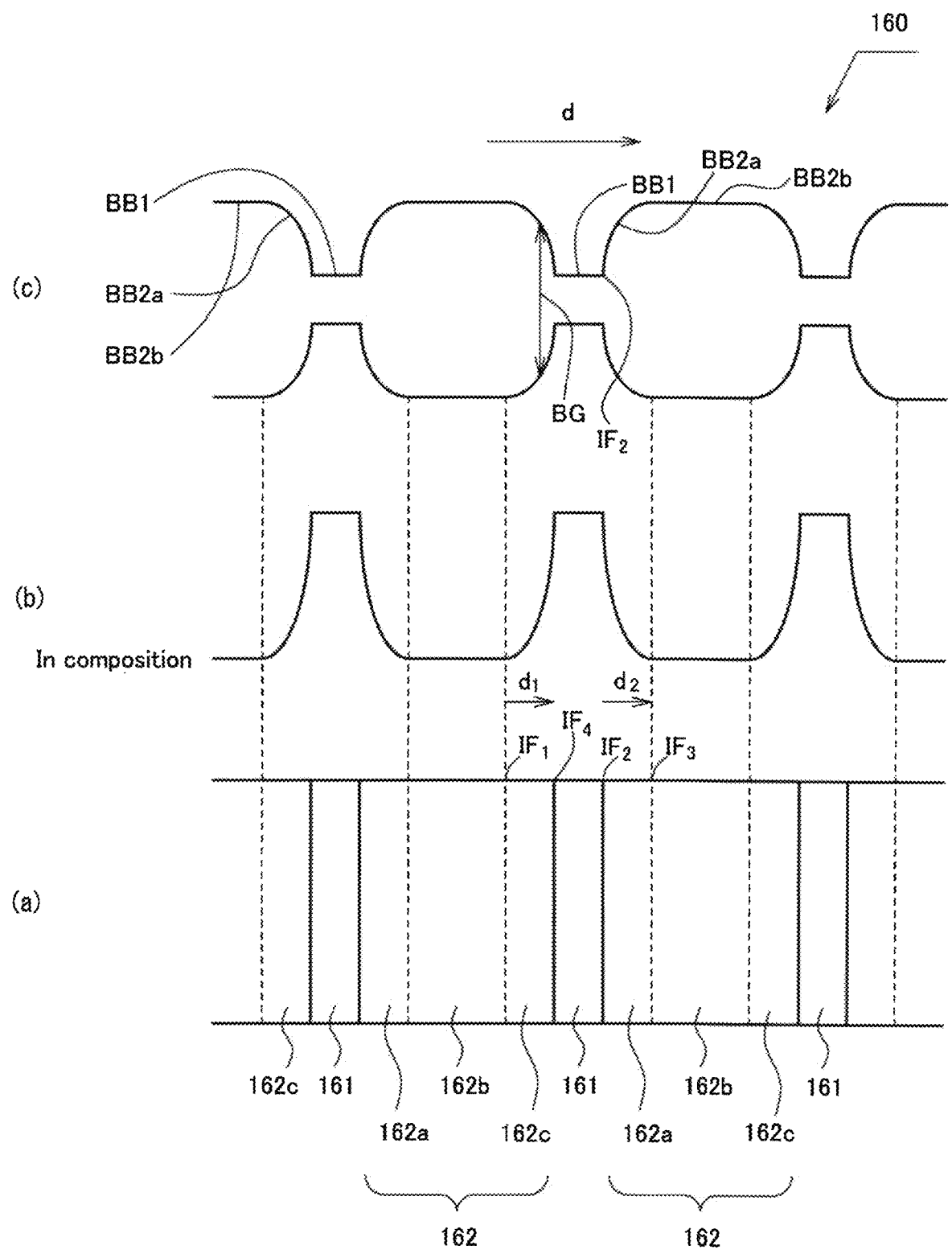
FIG. 2 is a view showing the relationship among deposition structure, In composition, and band structure of light-emitting layer 160 of the light-emitting device 100 according to the first embodiment.

FIG. 2 is a view showing the relationship among deposition structure, In composition (InN molar fraction, or simply In molar fraction), and band structure (energy levels of conduction band and valence band) of light-emitting layer 160 of the light-emitting device 100 according to the first embodiment. In FIG. 2, coordinate d is defined as the deposition direction. (a) indicates deposition structure, (b) indicates In composition, and (c) indicates band structure. In (c) of FIG. 2, energy level indicates potential energy of electron. Potential energy (eV) of electron increases in an upward direction, and potential energy of hole decreases in a downward direction. As shown in (a) of FIG. 2, the light-emitting layer 160 is formed by repeatedly depositing a well layer 161 and a barrier layer 162.

The well layer 161 is a first semiconductor layer. The barrier layer 162 is a second semiconductor layer in contact with the well layer 161. The well layer 161 is a Group III nitride semiconductor layer containing In. The barrier layer 162 is a Group III nitride semiconductor layer. In the first embodiment, the well layer 161 is an InGaN layer, and the barrier layer 162 is a GaN layer. As shown in (c) of FIG. 2, the barrier layer 162 has a band gap larger than a band gap of the well layer 161.

The barrier layer 162 has a variable composition layer 162a, an intermediate layer 162b, and a variable composition layer 162c. The intermediate layer 162b is a normal barrier layer. In the variable composition layer 162a and the variable composition layer 162c, the In composition is varied continuously in a streamline shape in the direction perpendicular to the surface in contact with the well layer 161. The In composition can be varied continuously in an exponential shape as described after. The intermediate layer 162b is sandwiched between the variable composition layer 162a and the variable composition layer 162c. The variable composition layer 162a and the variable composition layer 162c are in contact with the well layer 161. The intermediate layer 162b is not in contact with the well layer 161.

As shown in (c) of FIG. 2, the band gap of the well layer 161 is constant in the deposition direction. The band gap of the intermediate layer 162b is constant in the deposition direction. The band gap of the variable composition layer 162a and the variable composition layer 162c is varied in the deposition direction. It is because the In composition is varied in the deposition direction in the variable composition layer 162a and the variable composition layer 162c. As used herein, "deposition direction" refers to a direction perpendicular to a plate surface of the substrate 110.

As shown in (b) of FIG. 2, in the variable composition layer 162a and the variable composition layer 162c, the In composition is increased toward the well layer 161. That is, the closer the variable composition layer 162a and the variable composition layer 162c are to the well layer 161, the closer the In composition of the variable composition layer 162a and the variable composition layer 162c to the In composition of the well layer 161.

In the variable composition layer 162a and the variable composition layer 162c, the In composition is increased exponentially toward the well layer 161. That is, in the variable composition layer 162a and the variable composition layer 162c, band gap BG becomes narrow exponentially toward the well layer 161.

As shown in (c) of FIG. 2, the energy level of the bottom of conduction band BB1 of the well layer 161 is constant. The energy level of the bottom of conduction band BB2$b$ of the intermediate layer 162b is constant along the deposition direction. The energy level of the bottom of conduction band BB2$a$ of the variable composition layer 162a is decreased exponentially toward the well layer 161.

A boundary IF$_3$ between the energy level of the bottom of conduction band BB2$a$ of the variable composition layer 162a and the energy level of the bottom of conduction band BB2$b$ of the intermediate layer 162b is continued, that is, differential coefficient of the energy level BB2$a$ against the coordinate d is equal to differential coefficient of the energy level BB2$b$ against the coordinate d, and the both differential coefficients are preferably zeros. On the other hand, a boundary IF$_2$ between the energy level of the bottom of conduction band BB2$a$ of the variable composition layer 162a and the energy level of the bottom of conduction band BB1 of the well layer 161 is continued, however, the differential coefficient of the energy band BB2$a$ is not equal to the differential coefficient of the energy band BB1.

Composition of the well layer 161 is $In_xGa_{1-x}N$ (0<x≤1). In composition 100$x$ (defined as molar fraction, hereinafter the same shall apply) is defined as f(d), i.e., x=f(d). In the well layer 161 and the intermediate layer 162b, f(d) has a constant value. In the variable composition layer 162a, f(d) is typically decreased exponentially along the coordinate d in the deposition direction. In the variable composition layer 162c, f(d) is typically increased exponentially along the coordinate d in the deposition direction. That is, f(d) is approximately represented by $x=f(d_1)=a_1 \cdot exp(\alpha_1 d_1)+b_1$ in the variable composition layer 162c, and $x=f(d_2)=a_2 \cdot exp(-\alpha_2 d_2)+b_2$ in the variable composition layer 162a. Here, $d_1$ and $d_2$ are the distances from the interface IF$_1$ and IF$_2$, respectively. $a_1$, $b_1$, $a_2$ and $b_2$ are constant. $\alpha_1$ and $\alpha_2$ are coefficients defining In increasing factor and In decreasing factor, respectively. IF$_1$ is an interface between the intermediate layer 162b and the variable composition layer 162c and IF$_2$ is an interface between the well layer 161 and the variable composition layer 162a.

At an interface IF$_1$ between the variable composition layer 162c and the intermediate layer 162b, and a interface IF$_3$ between the variable composition layer 162a and the intermediate layer 162b, f(d) is a smooth differentiable curve, that is, differential coefficients of the f(d) in the variable composition layer 162c and the variable composition layer 162a are equal to a differential coefficient of the intermediate layer 162b (when energy level of the bottom of conduction band of the intermediate layer 162b is constant, those three differential coefficients are approximately equal to 0).

On the other hand, at an interface IF$_4$ between the variable composition layer 162c and the well layer 161, and an interface IF$_2$ between the variable composition layer 162a and the well layer 161, f(d) is not differentiable. Thus, in the variable composition layer 162a and the variable composition layer 162c, the In compositions are varied stepwise at the interfaces IF$_4$ and IF$_2$ to the well layer 161.

3. Method for Forming Light-Emitting Layer

Figure 3:
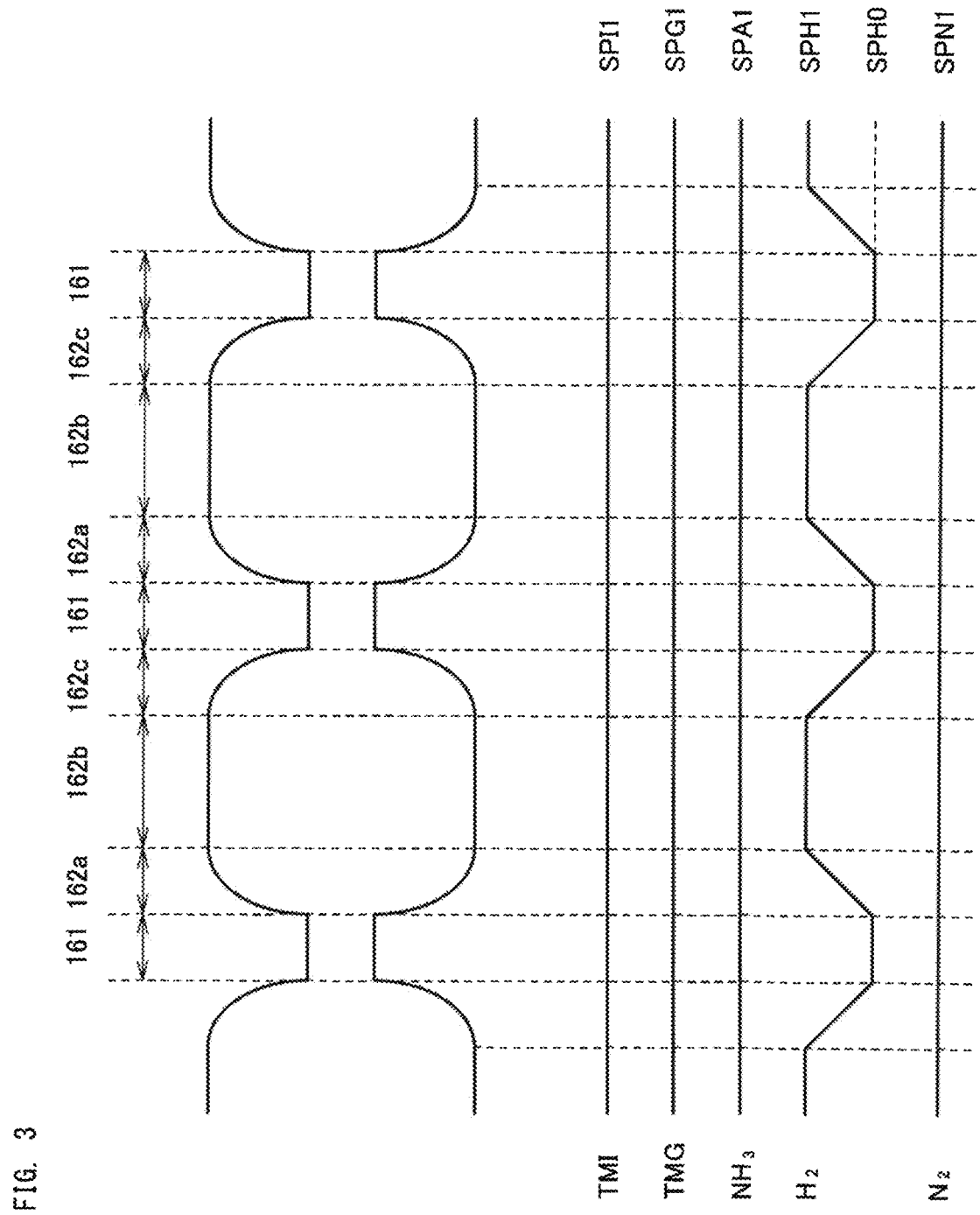
FIG. 3 is a view showing a method for forming the light-emitting layer 160 of the light-emitting device 100 according to the first embodiment.

FIG. 3 is a view showing a method for forming the light-emitting layer 160 of the light-emitting device 100 according to the first embodiment. FIG. 3 shows the relationship between the band structure of the light-emitting layer 160 and the gas supply amount. FIG. 3 shows a case where the well layer 161 is made of InGaN and the barrier layer 162 is made of GaN. In FIG. 3, time proceeds from left to right. In the first embodiment, the light-emitting layer 160 is epitaxially grown through Metal Organic Chemical Vapor Deposition (MOCVD).

The carrier gas employed is a mixture gas of hydrogen gas and nitrogen gas ($H_2+N_2$). Ammonia gas ($NH_3$) is used as a nitrogen source. Trimethylgallium ($Ga(CH_3)_3$:"TMG") is used as a gallium source. Trimethylindium ($In(CH_3)_3$: "TMI") is used as an indium source.

The flow rate of TMI is SPI1 and constant. The flow rate of TMG is SPG1 and constant. The flow rate of $NH_3$ is SPA1 and constant. The flow rate of $H_2$ is varied between SPH0 and SPH1. The flow rate of $N_2$ is SPN1 and constant. Thus, only the supply amount of $H_2$ is varied with time, and the supply amount of other gas is not varied with time.

Here, the supply amount SPH0 of $H_2$ is, for example, 0 sccm. The supply amount SPH1 of $H_2$ is, for example, 5 SLM. The supply amount of $H_2$ is monotonically increased and decreased in forming a variable composition layer 162a and a variable composition layer 162c, respectively. The absolute value of inclination of variation amount is constant in monotonous increase and decrease.

Thus, the In composition of the variable composition layer 162a and the variable composition layer 162c can be increased or decreased exponentially.

In the first embodiment, the flow rate of $H_2$ is varied with time while keeping the flow rate of a raw material gas such as TMG, TMI, and $NH_3$ as well as the flow rate of $N_2$ as carrier gas constant. In the semiconductor layer grown in a period when the flow rate of $H_2$ is varied, the In composition is varied exponentially. Accordingly, the band energy of the semiconductor layer is also varied exponentially.

In the first embodiment, the In composition can be adjusted by varying only the flow rate of $H_2$. As long as time differential coefficient of the flow rate of $H_2$ is constant, the In composition is varied exponentially. It is considered because In is etched to some degree by hydrogen gas.

The method for producing the light-emitting layer comprises growing a well layer 161, and growing a barrier layer 162. In at least one of growing a well layer 161 and growing a barrier layer 162, the well layer 161 and the barrier layer 162 are contacted. In growing a well layer 161 and growing a barrier layer 162, a mixture gas of hydrogen gas and nitrogen gas is used. However, hydrogen gas flow may be stopped or continued in growing the well layer 161. In growing the variable composition layer 162a, the flow rate of hydrogen gas is linearly increased with time elapse. In growing the intermediate layer 162b, the flow rate of hydrogen gas is constant with time elapse. In growing the variable composition layer 162c, the flow rate of hydrogen gas is linearly decreased with time elapse. In growing the barrier layer 162, the flow rate of hydrogen gas is higher than the flow rate of hydrogen gas in growing the well layer 161.

In growing the barrier layer 162, the flow rate of hydrogen gas is linearly varied.

As shown in FIG. 3, in producing the light-emitting layer 160, the flow rate of TMI, TMG, $NH_3$, and $N_2$ are constant.

4. Method for Producing Semiconductor Light-Emitting Device

Next will be described the method for producing the light-emitting device 100 according to the first embodiment. In the first embodiment, each semiconductor layer is epitaxially grown through Metal Organic Chemical Vapor Deposition (MOCVD).

The carrier gas employed is a gas containing at least one of hydrogen and nitrogen. Ammonia gas ($NH_3$) is used as a nitrogen source. Trimethylgallium ($Ga(CH_3)_3$:"TMG") is used as a gallium source. Trimethylindium ($In(CH_3)_3$: "TMI") is used as an indium source. Trimethylaluminum ($Al(CH_3)_3$:"TMA") is used as an aluminum source. Silane ($SiH_4$) is used as an n-type dopant gas, and bis(cyclopentadienyl)magnesium ($Mg(C_5H_5)_2$) is used as a p-type dopant gas.

An internal pressure of a MOCVD furnace is, for example, 1 kPa to 1 MPa. Reduced pressure growth is preferably performed as required. It is because the lower the internal pressure of the furnace during growth in the semiconductor production device, the more the lateral growth of the semiconductor layer is promoted and the migration of raw material is promoted on the surface of the substrate. Under a high temperature condition, the migration of raw material is further promoted on the surface of the substrate.

4-1. Preparing Substrate

A substrate 110 is prepared. The main surface of the substrate 110 is preferably a c-plane. The main surface of the substrate 110 may have an unevenness. The substrate 110 is placed in a susceptor of the MOCVD furnace. The surface of the substrate 110 may be reduced with hydrogen gas.

4-2. Forming Semiconductor Layer 4-2-1. Forming Buffer Layer

A buffer layer 120 is grown on the substrate 110. The substrate temperature is, for example, within a range of 300° C. to 1,200° C.

4-2-2. Forming n-Type Contact Layer

An n-type contact layer 130 is formed on the buffer layer 120. The substrate temperature is, for example, within a range of 900° C. to 1,200° C.

4-2-3. Forming n-Side Electrostatic Breakdown Preventing Layer

An n-side electrostatic breakdown preventing layer 140 is formed on the n-type contact layer 130. The substrate temperature is, for example, within a range of 750° C. to 950° C.

4-2-4. Forming n-Side Superlattice Layer

An n-side superlattice layer 150 is formed on the n-side electrostatic breakdown preventing layer 140. For example, an InGaN layer and an n-type GaN layer are repeatedly deposited. The substrate temperature is, for example, within a range of 700° C. to 950° C.

4-2-5. Forming Light-Emitting Layer

A light-emitting layer 160 is formed on the n-side superlattice layer 150. As a well layer 161, for example, an InGaN layer is formed. As a barrier layer 162, for example, a GaN layer is formed. As a barrier layer 162, a variable composition layer 162a, an intermediate layer 162b, and a variable composition layer 162c are sequentially formed. The substrate temperature is, for example, 600° C. to 950° C., preferably not more than 850° C., and more preferably not more than 800° C.

4-2-6. Forming Electron Blocking Layer

An electron blocking layer 170 is formed on the light-emitting layer 160. For example, a p-type GaN layer, a p-type AlGaN layer, and a p-type InGaN layer are repeatedly deposited. The substrate temperature is, for example, 800° C. to 1,200° C.

4-2-7. Forming p-Type Contact Layer

Figure 4:
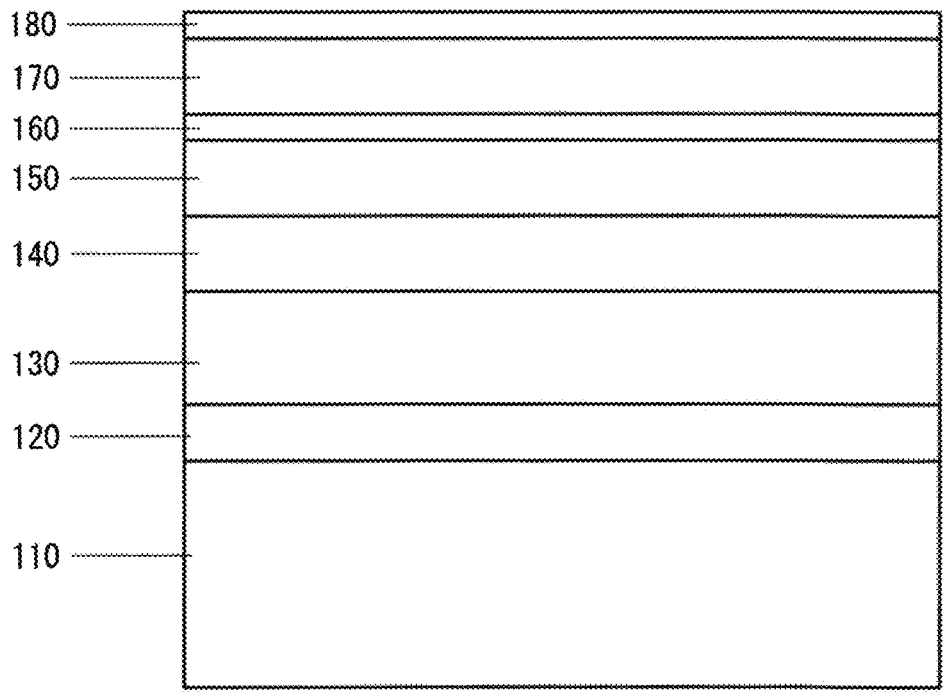
FIG. 4 is a view (part 1) for explaining a method for producing the light-emitting device 100 according to the first embodiment.

A p-type contact layer 180 is formed on the electron blocking layer 170. The substrate temperature is, for example, 800° C. to 1,200° C. In this way, a layered structure shown in FIG. 4 is obtained.

4-3. Forming Transparent Electrode

A transparent electrode TE1 is formed on the p-type contact layer 180. The technique of formation may be sputtering or vapor deposition.

4-4. Forming Electrode

Figure 5:
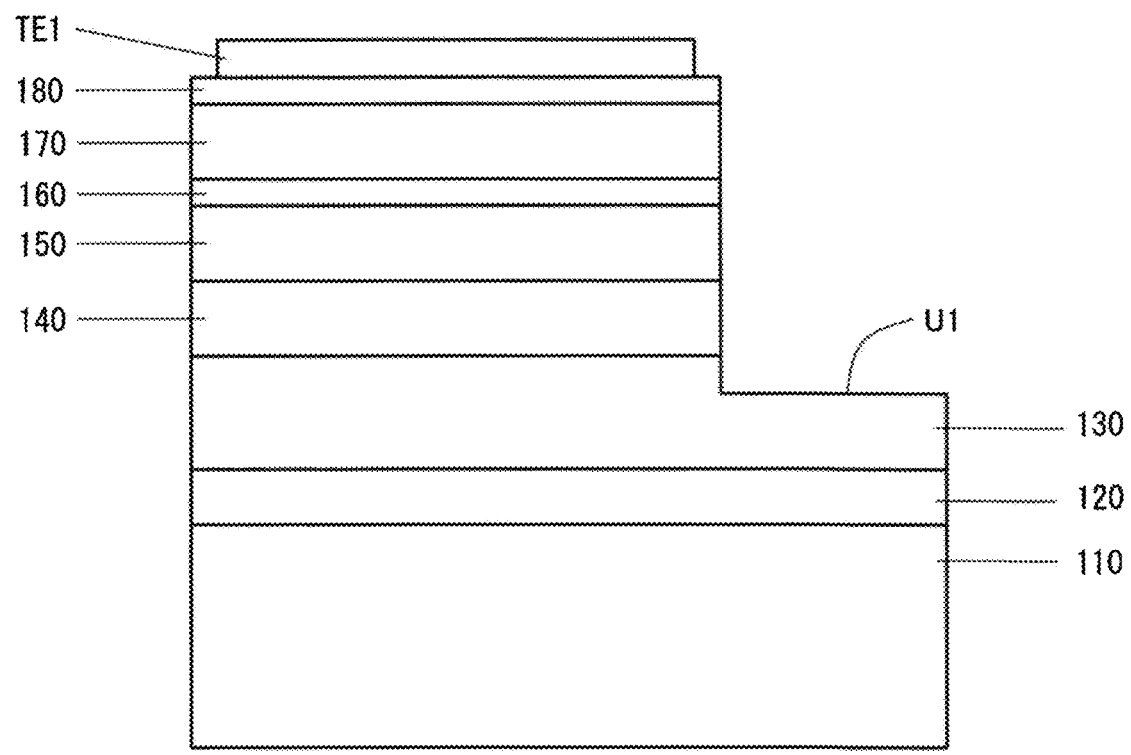
FIG. 5 a view (part 2) for explaining a method for producing the light-emitting device 100 according to the first embodiment.

As shown in FIG. 5, the semiconductor layers are partially removed through laser radiation or etching from the p-type contact layer 180 side, to thereby expose the n-type contact layer 130. An n-electrode N1 is formed on the thus-exposed region U1. A p-electrode P1 is formed on the transparent electrode TE1. Either of forming p-electrode P1 and forming n-electrode N1 may be performed first.

4-5. Other Steps

In addition to the aforementioned steps, additional steps such as dicing a device, covering a device with an insulating film and heat treatment may be carried out. In this way, the light-emitting device 100 shown in FIG. 1 is produced.

5. Comparison with Conventional Technique

Figure 6:
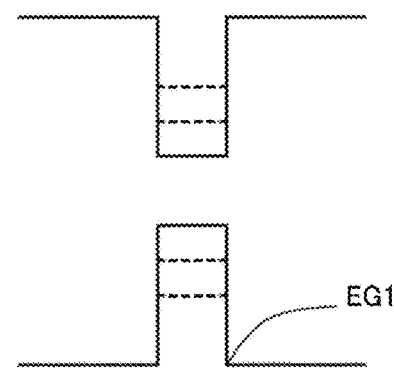
FIG. 6 is a view (part 1) showing the relationship between band structure of light-emitting layer of a conventional light-emitting device and supply amount of raw material.
Figure 6:
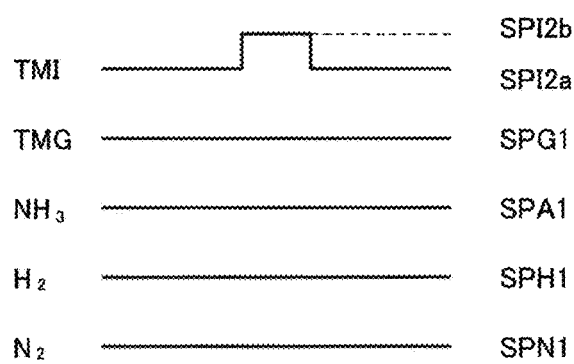

FIG. 6 is a view (part 1) showing the relationship between band structure of light-emitting layer of a conventional light-emitting device and supply amount of raw material. As shown in FIG. 6, in growing a well layer, the supply amount of TMI is switched from SPI2*a* to SPI2*b* at a time point. There is no period when the supply amount is continuously varied from SPI2*a* to SPI2*b*.

In FIG. 6, lattice constant is suddenly varied at an interface between the well layer and the barrier layer. Therefore, a large strain is generated at the interface between the well layer and the barrier layer. As a result, crystal quality is remarkably deteriorated and large piezoelectric field is induced, thereby considerably reducing light emission efficiency.

Figure 7:
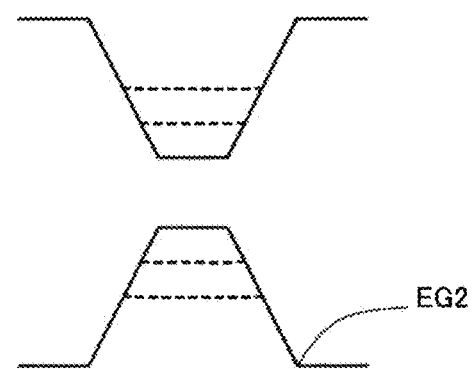
FIG. 7 is a view (part 2) showing the relationship between band structure of light-emitting layer of a conventional light-emitting device and supply amount of raw material.
Figure 7:
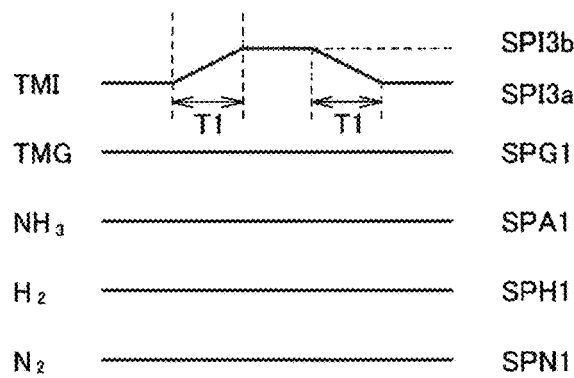

FIG. 7 is a view (part 2) showing the relationship between band structure of light-emitting layer of a conventional light-emitting device and supply amount of raw material. As shown in FIG. 7, in growing a well layer, the supply amount of TMI is gradually changed from SPI3*a* to SPI3*b*. That is, there is a period T1 when the supply amount is continuously changed from SPI3*a* to SPI3*b*.

As shown in FIG. 7, a lattice constant is gradually varied at an interface between the well layer and the barrier layer. Therefore, strain is relaxed to some degree compared with FIG. 6. However, strain is less relaxed compared with the light-emitting device 100 according to the first embodiment. A sub-band formation due to the quantum confinement effect is difficult because lattice constant is linearly varied. As a result, light emission efficiency is reduced.

6. Effects of First Embodiment

The light-emitting device 100 according to the first embodiment has the light-emitting layer 160 comprising the well layer 161 and the barrier layer 162. The barrier layer 162 comprises the variable composition layer 162*a*, the intermediate layer 162*b*, and the variable composition layer 162*c*. In the variable composition layer 162*a* and the variable composition layer 162*c*, the In composition is varied exponentially. Therefore, in the variable composition layer 162*a* and the variable composition layer 162*c*, the lattice constant is varied continuously in a streamline shape. Thereby, strain is relaxed. As a result, crystal quality is improved and strain-induced piezoelectric field is weakened. Thus, light emission efficiency is increased.

As the In composition is varied exponentially, the band energy is also varied exponentially. That is, the In composition is varied toward the well layer 161. In a vicinity of the interface between the well layer 161 and the variable composition layer 162*a* or the variable composition layer 162*c*, the band structure is similar to the structure shown in FIG. 6, and a sub-band is easily formed. Light is easily emitted between sub-bands, and the light emission efficiency of the light-emitting device 100 is increased.

At EG1 in FIG. 6 and EG2 in FIG. 7, there are interfaces having different lattice constants, and a strain is generated. A band bending is formed due to strain-induced piezoelectric field, and a barrier preventing carrier movement is formed. However, in the light-emitting device 100 according to the first embodiment, at positions corresponding to EG1 and EG2, the In composition is seamlessly varied. Therefore, as shown in FIGS. 6 and 7, a barrier preventing carrier movement is not formed. Thus, in the light-emitting device 100 according to the first embodiment, more carriers are injected to the well layer than in the conventional light-emitting device. That is, the light emission efficiency of the light-emitting device 100 is higher than the light emission efficiency of the conventional light-emitting device.

7. Variations 7-1. Multiple Step Variation

Figure 8:
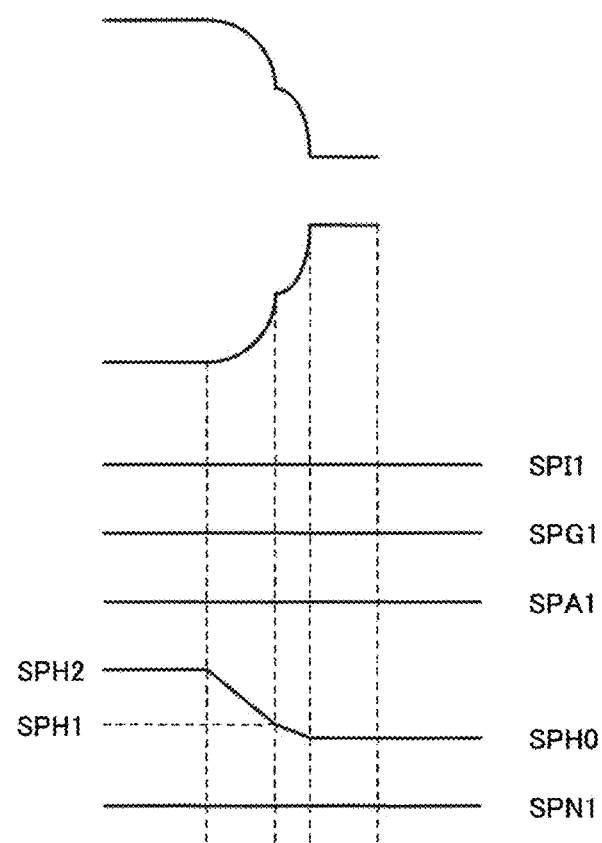
FIG. 8 is a view showing a method for forming a light-emitting layer of a light-emitting device in variations according to the first embodiment.

FIG. 8 is a view showing a method for forming a light-emitting layer of a light-emitting device in variations according to the first embodiment. As shown in FIG. 8, the flow rate of $H_2$ may be varied from SPH2 to SPH1, and after that, from SPH1 to SPH0. In this way, the flow rate of $H_2$ may be varied in two steps. Moreover, the flow rate of $H_2$ may be varied in two or more multiple steps.

7-2. TMI Variation

In the first embodiment, the flow rate of TMI is constant in forming a variable composition layer. However, the flow rate of TMI may be varied in growing a variable composition layer. Even in the case where TMI is varied, the In composition can be varied exponentially. For example, the flow rate of TMI may be varied as shown in FIGS. 6 and 7, while varying the flow rate of $H_2$ as shown in FIG. 3. For example, the flow rate of a raw material gas containing In in growing a well layer 161 is preferably higher than the flow rate of a raw material gas containing In in growing a barrier layer 162. A raw material gas containing In is not limited to TMI.

7-3. AlInGaN Layer

The well layer 161 is not limited to an InGaN layer, and the barrier layer 162 is not limited to a GaN layer. The well layer 161 may be made of Group III nitride semiconductor containing In. The barrier layer 162 may be made of Group III nitride semiconductor. However, the barrier layer 162 has a band gap larger than the band gap of the well layer 161. The well layer 161 preferably has an In composition of 5% or more.

7-4. Layer Between First Semiconductor Layer and Second Semiconductor Layer

A thin semiconductor layer may exist between the well layer 161 and the barrier layer 162. When the first semiconductor layer and the second semiconductor layer are not limited to the well layer 161 and the barrier layer 162, a thin semiconductor layer may exist between the first semiconductor layer and the second semiconductor layer. In this case, the first semiconductor layer and the second semiconductor layer are not contacted. A thin semiconductor layer between the first semiconductor layer and the second semiconductor layer has a thickness of, for example, not more than 3 nm.

7-5. Carrier Gas

In growing a first semiconductor layer and growing a second semiconductor layer, a gas containing hydrogen gas as a carrier gas may be used. However, the carrier gas is preferably a mixture gas of hydrogen gas and nitrogen gas.

7-6. Average In Composition

The second semiconductor layer may be a Group III nitride semiconductor layer containing In. In this case, the average In composition of the second semiconductor layer is lower than the average In composition of the first semiconductor layer.

7-7. Well Layer and Barrier Layer

The well layer 161 may be made of any material other than InGaN. The barrier layer 162 may be made of any material other than GaN. For example, the barrier layer 162 may contain In. The well layer 161 may be made of $Al_xIn_yGa_zN$ ($0 \leq x \leq 1$, $0 < y \leq 1$, $0 \leq z \leq 1$, $x+y+z=1$), and the barrier layer 162 may be made of $Al_xIn_yGa_zN$ ($0 \leq x \leq 1$, $0 \leq y \leq 1$, $0 \leq z \leq 1$, $x+y+z=1$). However, the well layer 161 contains at least In, and the band gap of the barrier layer 162 is larger than the band gap of the well layer 161.

7-8. Relationship Between Well Layer and Intermediate Layer

In FIG. 2, the well layer 161 is not in contact with the intermediate layer 162b. However, the well layer 161 may be partially in contact with the intermediate layer 162b.

7-9. Thickness

The thickness of the well layer 161 and the barrier layer 162 is not particularly limited. In terms of surface roughness of semiconductor layer, the thickness of the well layer 161 is preferably 0.5 nm to 50 nm, more preferably 1 nm to 10 nm, and further preferably 1.5 nm to 5 nm. The thickness of the barrier layer 162 is preferably 3 nm to 100 nm, more preferably 5 nm to 50 nm, and further preferably 5 nm to 30 nm.

7-10. Film Deposition Rate

The film deposition rate of the well layer 161 and the barrier layer 162 is not particularly limited. In terms of quality of semiconductor layer, the film deposition rate is preferably 0.5 nm/min to 50 nm/min.

7-11. Application to Layer Other than Light-Emitting Layer

In the first embodiment, a variable composition layer 162a and a variable composition layer 162c are formed as a barrier layer 162. However, the technique of varying composition in the first embodiment may be applied to an n-side superlattice layer 150, an electron blocking layer 170, and others. Or, it may be applied to a guide layer. It is because strain in the semiconductor layer to which the technique was applied, is relaxed.

7-12. Only One Variable Composition Layer

Only one of the variable composition layer 162a and the variable composition layer 162c may be formed. Therefore, there are cases where the variable composition layer exists only on the n-type layer side viewed from the well layer 161, and where the variable composition layer exists only on the p-type layer side viewed from the well layer 161 well layer 161.

7-13. Face-Down Type

The technique of the first embodiment may be applied to a face-down LED as well as a face-up LED. In this case, a metal electrode having higher reflectivity may be used instead of a transparent electrode.

7-14. Temporary Interruption of Growth

In the first embodiment, a well layer 161, a variable composition layer 162a, an intermediate layer 162b, and a variable composition layer 162c are continuously grown. However, after these layers are grown, growth may be temporarily interrupted.

7-15. Cycle

The number of repetition cycles of the well layer 161 and the barrier layer 162 is, for example, 1 to 50. The number of repetition cycles is preferably 1 to 10, more preferably 1 to 5, and further preferably 1 to 3.

7-16. Combinations

The above variations may be combined with one another without any restriction.

Second Embodiment

A second embodiment will be described.

1. Laser Device

Figure 9:
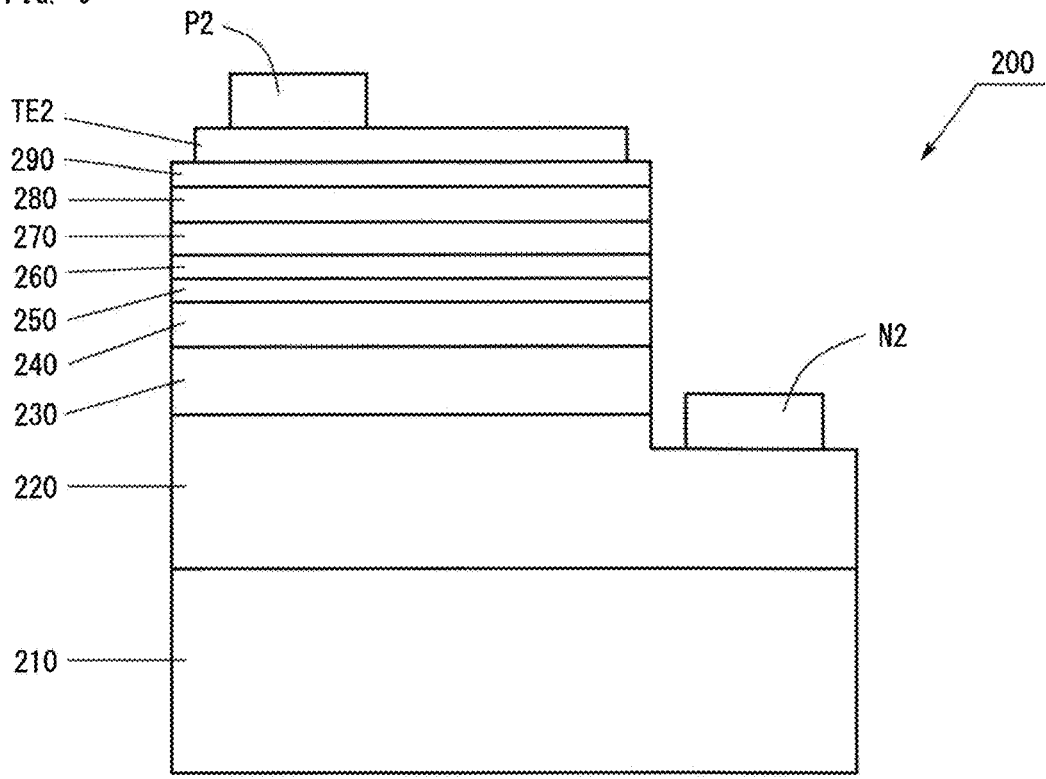
FIG. 9 is a schematic view of a laser device 200 according to a second embodiment.

FIG. 9 is a schematic view of the structure of a laser device 200 according to a second embodiment. The laser device 200 has a substrate 210, an n-type contact layer 220, an n-side cladding layer 230, an n-side guide layer 240, an active layer 250, a p-side guide layer 260, a p-side electron barrier layer 270, a p-side cladding layer 280, a p-type contact layer 290, a transparent electrode TE2, an n-electrode N2, and a p-electrode P2.

The active layer 250 has a well layer and a barrier layer. The barrier layer of the active layer 250 has a variable composition layer and an intermediate layer as with the barrier layer 162 of the first embodiment. The intermediate layer is sandwiched between two variable composition layers, and two variable composition layers are in contact with different well layers, respectively.

2. Effects of Second Embodiment

In the laser device 200, strain in the active layer 250 is relaxed as in the first embodiment.

3. Variations 3-1. Active Layer

The active layer may be a first semiconductor layer, and the guide layer may be a second semiconductor layer. The average In composition of the active layer is higher than the average In composition of the guide layer. The average In composition of the active layer is indicated by the amount of In to the total volume of the well layer and the barrier layer.

3-2. Structure of Device

Figure 10:
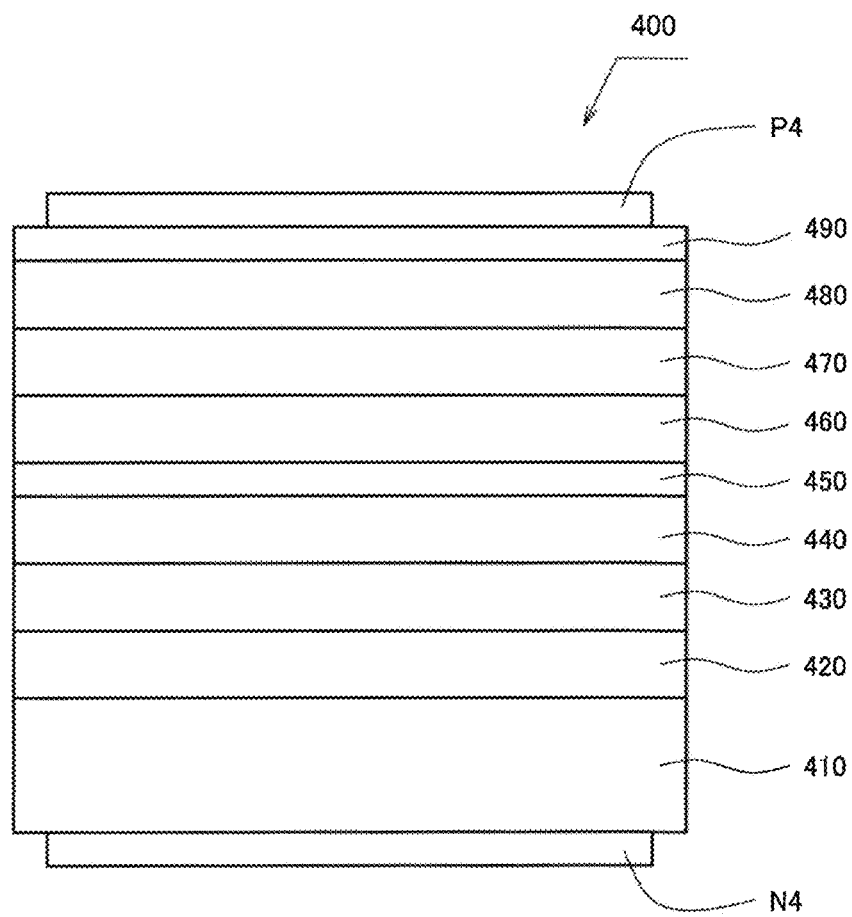
FIG. 10 is a schematic view of the structure of a laser device 400 in variations according to a second embodiment.

FIG. 10 is a schematic view of the structure of a laser device 400 in variations according to a second embodiment. The laser device 400 has an n-type GaN substrate 410, an n-type GaN layer 420, an n-side cladding layer 430, an n-side guide layer 440, an active layer 450, a p-side guide layer 460, a p-side electron barrier layer 470, a p-side cladding layer 480, a p-side contact layer 490, an n-electrode N4, and a p-electrode P4.

The n-type GaN layer 420 is, for example, a Si-doped n-type GaN. The n-side cladding layer 430 is, for example, a Si-doped n-type AlGaN layer. The n-side guide layer 440 is, for example, an InGaN layer. The active layer 450 is, for example, a layer formed by alternately repeating an InGaN layer and a GaN layer. The p-side guide layer 460 is, for example, an InGaN layer. The p-side electron barrier layer 470 is, for example, a Mg-doped p-type AlGaN layer. The p-side cladding layer 480 is, for example, a Mg-doped p-type AlGaN layer. The p-side contact layer 490 is, for example, a Mg-doped p-type GaN layer.

The laser device may be a Vertical Cavity Surface Emitting Laser (VCSEL) type device.

3-3. Combinations

The above variations may be combined with one another without any restriction.

Third Embodiment

A third embodiment will be described.

1. Solar Cell

Figure 11:
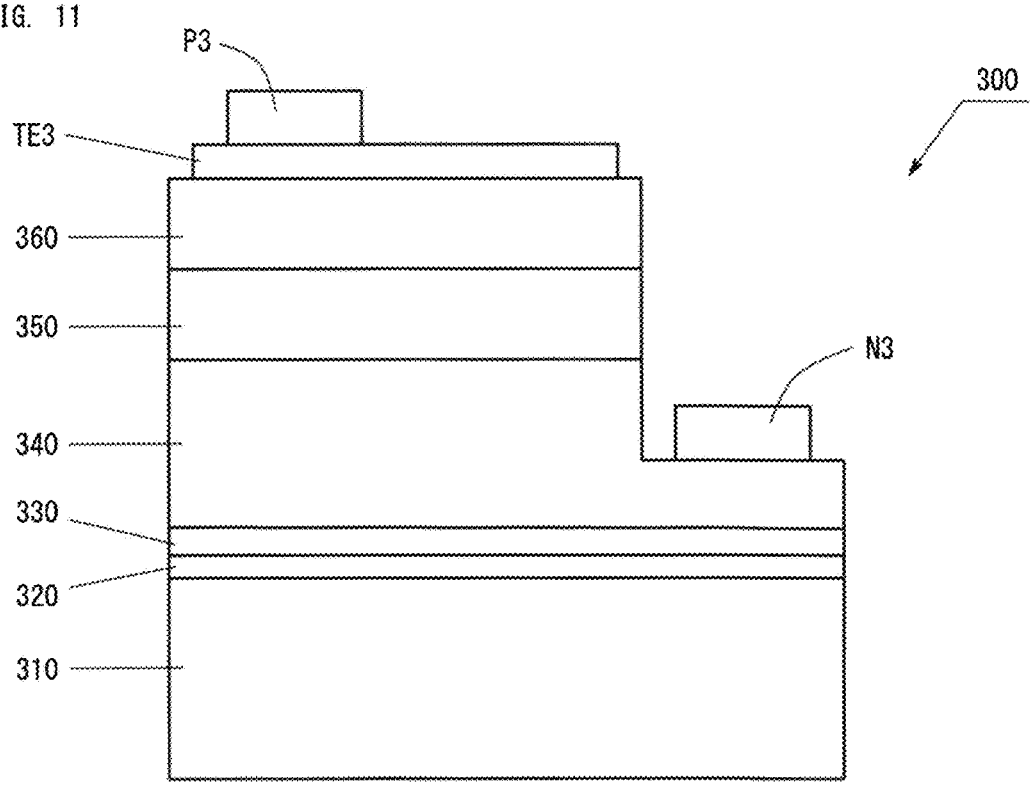
FIG. 11 is a schematic view of the structure of a solar cell 300 according to a third embodiment.

FIG. 11 is a schematic view of the structure of a solar cell 300 according to a third embodiment. The solar cell 300 has a substrate 310, a buffer layer 320, an n-type GaN layer 330, an n-type InGaN layer 340, an InGaN layer 350, a p-type InGaN layer 360, a transparent electrode TE3, an n-electrode N3, and a p-electrode P3.

The transparent electrode TE3 is formed on the p-type InGaN layer 360. The p-electrode P3 is formed on the transparent electrode TE3. The n-electrode N3 is formed on the n-type InGaN layer 340.

The InGaN layer 350 has an In composition higher than a In composition of the n-type InGaN layer 340 and the p-type InGaN layer 360. Therefore, the technique of the first embodiment is applicable to the n-type InGaN layer 340, the InGaN layer 350, and the p-type InGaN layer 360. That is, the n-type InGaN layer 340 and the p-type InGaN layer 360 have a variable composition layer at a position in contact with the InGaN layer 350.

2. Effects of Third Embodiment

As in the first embodiment, in the solar cell 300, strain in a vicinity of the InGaN layer 350 is relaxed.

Combinations of Embodiments

The first embodiment to the third embodiment including variations may be combined.

(Experiments)

1. Production of Sample

Samples were produced using MOCVD. A template substrate was prepared by growing an epitaxial GaN layer on a GaN substrate. An InGaN layer was formed on the GaN layer by supplying TMI, TMG, $NH_3$, $H_2$, and $N_2$. At this time, the flow rate of $H_2$ and TMI were varied. And the In composition of the grown semiconductor was measured.

2. Hydrogen Gas and in Composition

Figure 12:
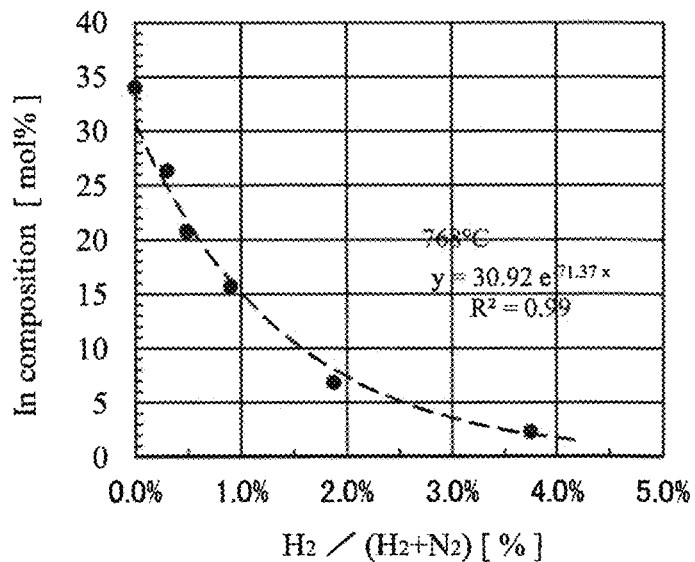
FIG. 12 is a graph (part 1) showing the relationship between flow rate ratio of hydrogen gas to carrier gas and In composition of semiconductor.

FIG. 12 is a graph (part 1) showing the relationship between flow rate ratio of hydrogen gas to carrier gas and In composition of semiconductor. The horizontal axis of FIG. 12 indicates the flow rate ratio (vol %) of the hydrogen gas ($H_2$) to the carrier gas ($H_2+N_2$). The vertical axis of FIG. 12 indicates the In composition (InN molar fraction, or In molar fraction) of grown semiconductor.

As shown in FIG. 12, when the flow rate ratio of the hydrogen gas to the carrier gas is increased, the In composition of semiconductor is decreased exponentially. On the other hand, when the flow rate ratio of the hydrogen gas to the carrier gas is decreased, the In composition of semiconductor is increased exponentially.

Generally, the In composition (In/Ga solid phase ratio (molar ratio)) is lower than the In/Ga vapor phase ratio. The In/Ga vapor phase ratio is the ratio of partial pressure of TMI supply to partial pressure of TMG supply. In has a surface adsorption power weaker than does Ga, and easily dissolved and reevaporated with heat or etching gas. When hydrogen gas as a carrier gas having etching action is not contained, the In composition (In/Ga solid phase ratio) is closest to the In/Ga vapor phase ratio. The higher the hydrogen gas in the carrier gas, the lower the In composition. This is considered because hydrogen gas etches In.

Figure 13:
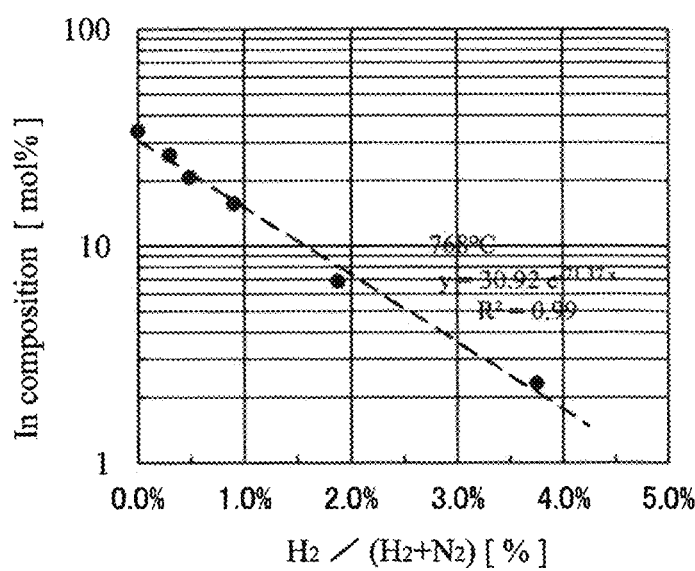
FIG. 13 is a graph (part 2) showing the relationship between flow rate ratio of hydrogen gas to carrier gas and In composition of semiconductor.

FIG. 13 is a graph (part 2) showing the relationship between flow rate ratio of hydrogen gas to carrier gas and In composition of semiconductor. FIG. 13 is a graph where the vertical axis of FIG. 12 is logarithmically transformed. As shown in FIG. 13, the measured values of In composition fall on a straight line. That is, the In composition is varied exponentially to the flow rate ratio of hydrogen gas to carrier gas.

Figure 14:
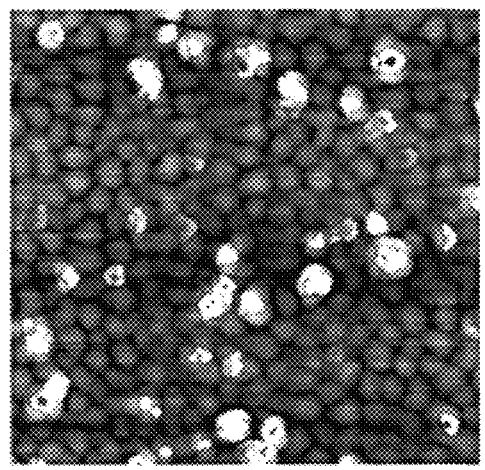
FIG. 14 is an AFM image showing surface of semiconductor layer when flow rate ratio of hydrogen gas to carrier gas is 0%.

FIG. 14 is an AFM image of surface of semiconductor layer when flow rate ratio of hydrogen gas to carrier gas is 0%. The AFM image is a photograph taken by an atomic force microscope (AFM). As shown in FIG. 14, the surface of semiconductor is extremely rough. This is considered because surface migration of In atoms during growth is insufficient, and three-dimensional growth easily takes place. As a result, a cluster is formed, where In is locally collected, and In droplets are easily formed. When the three-dimensional growth is accelerated, unevenness or defect in the surface quality is increased, thereby causing remarkable deterioration of crystal quality.

3. AFM Image

Figure 15:
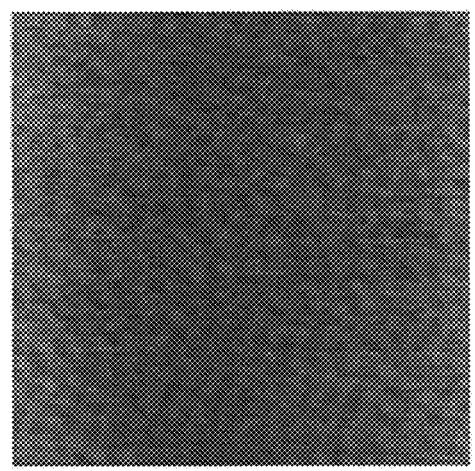
FIG. 15 is an AFM image showing surface of semiconductor layer when flow rate ratio of hydrogen gas to carrier gas is 0.3%.

FIG. 15 is an AFM image of surface of semiconductor layer when flow rate ratio of hydrogen gas to carrier gas is 0.3%. As shown in FIG. 15, the surface of semiconductor is flat. It is considered because migration of In on the surface of semiconductor was improved by hydrogen gas. When the carrier gas contains even a little bit of hydrogen gas even a little bit, In is etched, and the In composition is slightly decreased. Hydrogen gas remarkably improves crystal quality while suppressing the formation of In cluster due to three-dimensional growth.

Figure 16:
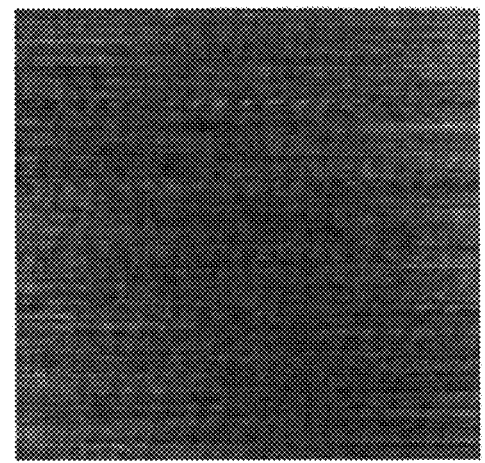
FIG. 16 is an AFM image showing surface of semiconductor layer when flow rate ratio of hydrogen gas to carrier gas is 1.9%.

FIG. 16 is an AFM image of surface of semiconductor layer when flow rate ratio of hydrogen gas to carrier gas is 1.9%. As shown in FIG. 16, the surface of semiconductor is flat as when the flow rate ratio of hydrogen gas to carrier gas is 0.3%.

4. Flow Rate of TMI

Figure 17:
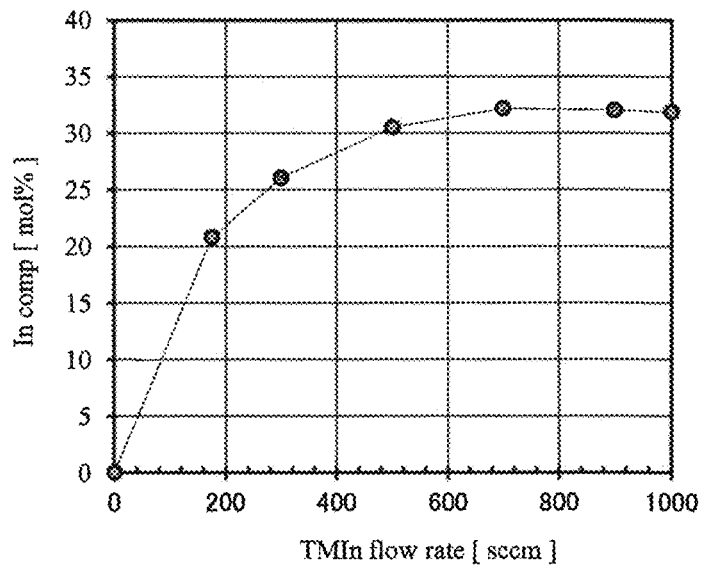
FIG. 17 is a graph showing the relationship between TMI flow rate and In composition of semiconductor when flow rate ratio of hydrogen gas to carrier gas is 0.5%.

FIG. 17 is a graph showing the relationship between TMI flow rate and In composition of grown semiconductor when flow rate ratio of hydrogen gas to carrier gas is 0.5%. The horizontal axis of FIG. 17 indicates the TMI flow rate (sccm). The vertical axis of FIG. 17 indicates the In composition (mol %). As shown in FIG. 17, when the TMI flow rate is increased, the In composition of grown semiconductor is increased. When the TMI flow rate is not less than 600 sccm, the In composition of semiconductor is saturated. Even though the supply amount of In is excessive, surface roughness of semiconductor is not observed. It is because In migration on the surface was improved, and the formation of In cluster was suppressed by etching action.

Figure 18:
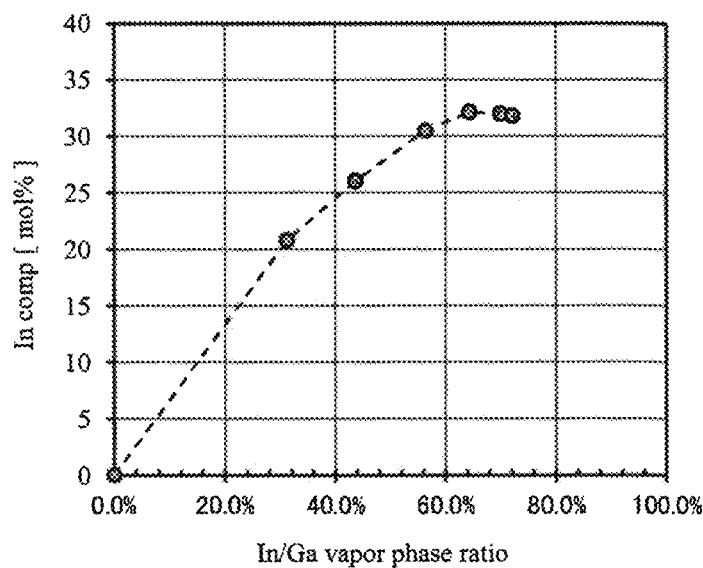
FIG. 18 is a graph showing the relationship between In/Ga vapor phase ratio and In composition of semiconductor when flow rate ratio of hydrogen gas to carrier gas is 0.5%.

FIG. 18 is a graph showing the relationship between In/Ga vapor phase ratio and In composition of grown semiconductor when flow rate ratio of hydrogen gas to carrier gas is 0.5%. The horizontal axis of FIG. 18 indicates the In/Ga vapor phase ratio (vol %). The vertical axis of FIG. 18 indicates the In composition (mol %) of semiconductor. As shown in FIG. 18, when the In/Ga vapor phase ratio is increased, the In composition of semiconductor tends to be increased. When the In/Ga vapor phase ratio is not less than 60 vol %, the In composition of semiconductor is saturated to some degree.

5. Photoluminescence

A light-emitting device was produced, in which a variable composition layer is formed only on the n-type layer side viewed from the well layer. A layer corresponding to the intermediate layer is in contact with the well layer on the p-type layer side viewed from the well layer.

Figure 19:
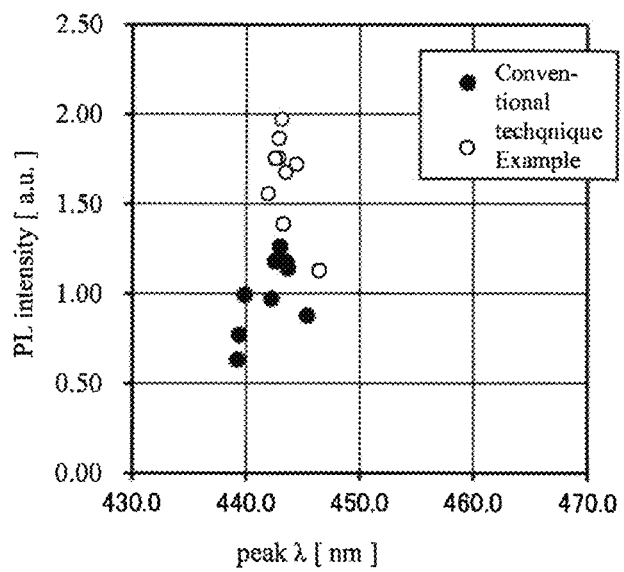
FIG. 19 is a graph showing intensity of photo-luminescence.

FIG. 19 is a graph showing intensity of photo-luminescence. The horizontal axis of FIG. 19 indicates the peak wavelength. The vertical axis of FIG. 19 indicates the photo-luminescence intensity. The average photo-luminescence intensity of the conventional light-emitting device was set as 1. The average photo-luminescence intensity of the light-emitting device of the embodiment having the variable composition layer whose In composition is varied exponentially, is approximately 1.67. Thus, the photo-luminescence intensity of the light-emitting device of the embodiment is larger than that of the conventional light-emitting device.

FIG. 19 shows that crystal quality was improved because strain was relaxed by the variable composition layer of the embodiment and that quantum-confined stark effect (QCSE) and quantum-confined Franz-Keldysh effect (QCFK) were reduced.

Figure 20:
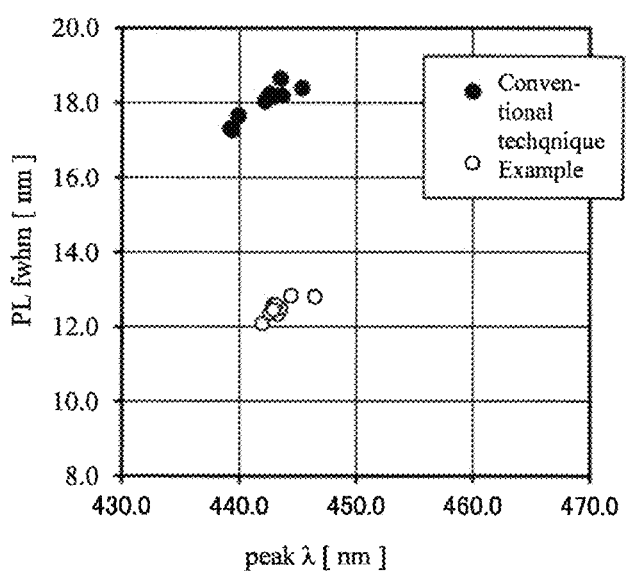
FIG. 20 is a graph showing photo-luminescence FWHM.

FIG. 20 is a graph showing photo-luminescence FWHM. The horizontal axis of FIG. 20 indicates the peak wavelength. The vertical axis of FIG. 20 indicates the photo-luminescence FWHM. The average photo-luminescence FWHM of the light-emitting device of the embodiment is approximately 12.5 nm. The average photo-luminescence FWHM of the conventional light-emitting device is approximately 18 nm. The photo-luminescence FWHM of the light-emitting device of the embodiment is narrower than that of the conventional light-emitting device.

FIG. 20 shows that crystal quality was improved because strain was relaxed by the variable composition layer of the embodiment, that quantum-confined stark effect (QCSE) and quantum-confined Franz-Keldysh effect (QCFK) were reduced, and that in-plane uniformity was improved because flatness of the light-emitting layer was improved, thereby improving fluctuation in in-plane light emission.

What is claimed is:

1. A method for producing a Group III nitride semiconductor device, the method comprising:
   growing a first semiconductor layer; and
   growing a second semiconductor layer, wherein
   the first semiconductor layer is a Group III nitride semiconductor layer containing In,
   the second semiconductor layer is a Group III nitride semiconductor layer,
   the second semiconductor layer has a band gap larger than a band gap of the first semiconductor layer,
   a flow rate of hydrogen gas used as a carrier gas in growing a second semiconductor layer is larger than a flow rate of hydrogen gas in growing a first semiconductor layer, and
   in growing a second semiconductor layer, a variable composition layer in which an In composition is varied continuously in a streamline shape along the deposition direction of the second semiconductor layer, and an intermediate layer sandwiched between two variable composition layers are formed.

2. The method for producing a Group III nitride semiconductor device according to claim 1, wherein the flow rate of the hydrogen gas is linearly increased or decreased at least one of an initial stage and a final stage of the growth of the second semiconductor layer.

3. The method for producing a Group III nitride semiconductor device according to claim 1, wherein a mixture gas of hydrogen gas and nitrogen gas is used as a carrier gas in growing a first semiconductor layer and the second semiconductor layer.

4. The method for producing a Group III nitride semiconductor device according to claim 1, wherein the first semiconductor layer and the second semiconductor layer are brought into contact with each other in growing a first semiconductor layer and the second semiconductor layer.

5. The method for producing a Group III nitride semiconductor device according to claim 1, wherein the flow rate of a raw material gas containing In is constant in growing a first semiconductor layer and the second semiconductor layer.

6. The method for producing a Group III nitride semiconductor device according to claim 1, wherein the flow rate of a raw material gas containing In in growing a first semiconductor layer, is larger than a flow rate of a raw material gas containing In in growing a second semiconductor layer.

7. The method for producing a Group III nitride semiconductor device according to claim 1, wherein the second semiconductor layer is a Group III nitride semiconductor layer containing In, and the second semiconductor layer has an average In composition lower than an average In composition of the first semiconductor layer.

8. The method for producing a Group III nitride semiconductor device according to claim 1, wherein the first semiconductor layer is a well layer, and the second semiconductor layer is a barrier layer.

9. The method for producing a Group III nitride semiconductor device according to claim 1, wherein
   the first semiconductor layer is an active layer,
   the second semiconductor layer is a guide layer, and
   the active layer has an average In composition higher than an average In composition of the guide layer.

10. A method for producing a Group III nitride semiconductor device, the method comprising:
    growing a first semiconductor layer; and
    growing a second semiconductor layer, wherein
    the first semiconductor layer is a Group III nitride semiconductor layer containing In,
    the second semiconductor layer is a Group III nitride semiconductor layer,
    the second semiconductor layer has a band gap larger than a band gap of the first semiconductor layer,
    a flow rate of hydrogen gas used as a carrier gas in growing the second semiconductor layer is larger than a flow rate of hydrogen gas in growing the first semiconductor layer, and
    a variation mode of the flow rate of the hydrogen gas comprises at least one mode, one mode being a linearly increased mode in an initial stage of the growth of the second semiconductor layer, the other mode being a linearly decreased mode in a final stage of the growth of the second semiconductor layer.

11. The method for producing a Group III nitride semiconductor device according to claim 10, wherein the flow rate of a raw material gas containing In is constant in growing a first semiconductor layer and the second semiconductor layer.

12. A method for producing a Group III nitride semiconductor having a hetero junction of layers having different band gaps, a layer having a smaller bandgap including In, the method comprising at least one of a first case and a second case, wherein,
    in the first case, hydrogen gas as a carrier gas is continuously increased in forming a layer having a larger band gap from the layer having the smaller band gap, thereby, forming a first type variable composition layer in which an In composition is continuously decreased in a streamline shape along the deposition direction, and
    in the second case, hydrogen gas as a carrier gas is continuously decreased in forming the layer having the smaller band gap from a layer having a larger band gap, thereby, forming a second type variable composition layer in which an In composition is continuously increased in a streamline shape along the deposition direction.

13. The method for producing a Group III nitride semiconductor according to claim 12, wherein
    in the first case, a variable rate of band gap in the deposition direction is continuously decreased to become equal to a variable rate of band gap of the layer having the larger bandgap, and
    in the second case, a variable rate of band gap in the deposition direction is continuously increased, and is discontinuous with a variable rate of band gap of the layer having the smaller bandgap.

14. The method for producing a Group III nitride semiconductor according to claim 12, wherein
    in the first case, a variable rate of In composition ratio in the deposition direction is continuously decreased, and
    in the second case, a variable rate of In composition ratio in the deposition direction is continuously increased.

15. The method for producing a Group III nitride semiconductor according to claim 12, wherein
a flow rate of a raw material gas as a component of the Group III nitride semiconductor is constant.

* * * * *